(12) United States Patent
Chuang

(10) Patent No.: US 12,148,440 B2
(45) Date of Patent: Nov. 19, 2024

(54) AUDIO PROCESSING CIRCUIT WHOSE OUTPUT STAGE HAS DIFFERENT CONFIGURATION BASED ON SIGNAL STRENGTH

(71) Applicant: Realtek Semiconductor Corp., HsinChu (TW)

(72) Inventor: Tsung-Peng Chuang, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 268 days.

(21) Appl. No.: 17/534,398

(22) Filed: Nov. 23, 2021

(65) Prior Publication Data

US 2022/0343930 A1 Oct. 27, 2022

(30) Foreign Application Priority Data

Apr. 21, 2021 (TW) .................................. 110114380

(51) Int. Cl.
  *G10L 21/0208* (2013.01)
  *G10L 21/0216* (2013.01)
  *H03F 3/217* (2006.01)

(52) U.S. Cl.
  CPC ........ *G10L 21/0216* (2013.01); *H03F 3/2175* (2013.01); *G10L 2021/02085* (2013.01)

(58) Field of Classification Search
  None
  See application file for complete search history.

(56) References Cited

U.S. PATENT DOCUMENTS

| 10,658,988 | B1 | 5/2020 | Song |
| 2005/0024128 | A1 | 2/2005 | Pasternak |
| 2010/0321116 | A1 | 12/2010 | Kim |
| 2016/0065158 | A1 | 3/2016 | Lesso |
| 2018/0205347 | A1 | 7/2018 | Das |
| 2019/0386626 | A1 | 12/2019 | Lesso |
| 2021/0104984 | A1 | 4/2021 | Lesso |

FOREIGN PATENT DOCUMENTS

| JP | 2005-236535 A | 9/2005 |
| JP | 2012-209612 A | 10/2012 |
| JP | 2013-37659 A | 2/2013 |
| KR | 10-1116898 B1 | 3/2012 |
| WO | 2015/041067 A1 | 3/2015 |

*Primary Examiner* — James K Mooney
(74) *Attorney, Agent, or Firm* — Winston Hsu

(57) ABSTRACT

The present invention discloses an audio processing circuit, wherein when the audio processing circuit determines that a signal being processed is a small signal, an output stage uses a regulated supply voltage provided by a voltage regulator, and the output stage uses an open-loop structure to reduce noise of an output audio signal; and when the audio processing circuit determines that the signal being processed is a large signal, the output stage directly uses the supply voltage without using the regulated supply voltage, and the output stage uses a closed-loop structure to reduce the total harmonic distortion of the output audio signal. By using the present invention, the audio processing circuit can have a good performance indicator with a small chip area design.

6 Claims, 3 Drawing Sheets

Large signal mode

AUDIO PROCESSING CIRCUIT WHOSE OUTPUT STAGE HAS DIFFERENT CONFIGURATION BASED ON SIGNAL STRENGTH

BACKGROUND OF THE INVENTION

1. Field of the Invention

The present invention relates to an audio processing circuit.

2. Description of the Prior Art

A class-D power amplifier is a technology commonly used in audio processing circuits, and it has high efficiency to generate output audio signals to drive speakers to play sound, so it is widely used in electronic products in the personal computer, consumer electronic products, or automotive electronic products. The class-D power amplifier usually has a closed-loop structure to eliminate its own nonlinear phenomena and noise caused by the supply voltage, so as to improve performance indicators such as total harmonic distortion and noise (THD+N), intermodulation distortion (IMD) or power supply rejection ratio (PSRR).

In view of the differences in the formats of the received input audio signals, audio processing circuits can generally be divided into digital input types and analog input types. With the increasingly advanced semiconductor process, digital input type audio processing circuits will have better performance in terms of chip area. In addition, if most of the circuits in the audio processing circuit can be implemented by digital circuits, it can make the overall product more competitive. However, considering that the class-D power amplifier has the closed-loop structure, if a modulation circuit within the audio processing circuit is implemented by digital circuits, an analog-to-digital converter (ADC) needs to be positioned in the feedback path. The ADC, which has analog circuits, cannot enjoy the benefits of the advanced semiconductor processes, that is, the chip area cannot be effectively reduced. In addition, in order to maintain the performance of the class-D power amplifier, it is necessary to design a larger area ADC to make the feedback signal have better performance, but a large area ADC will prevent the chip area of the audio processing circuit from being further reduced.

SUMMARY OF THE INVENTION

It is therefore an objective of the present invention to provide an audio processing circuit, which can have good performance with a small chip area, so as to solve the problems described in the prior art.

According to one embodiment of the present invention, an audio processing circuit comprising a digital signal processing circuit, a digital modulation circuit, an output stage, a voltage regulator and a signal detection circuit is disclosed. The digital signal processing circuit is configured to process a digital audio signal to generate a processed signal. The digital modulation circuit is configured to generate a modulated signal according to the processed signal. The output stage is configured to generate an output audio signal according to the modulated signal. The voltage regulator is configured to receive a supply voltage to generate a regulated supply voltage. The signal detection circuit is configured to detect a signal strength of the digital audio signal and/or the processed signal to generate a first control signal to control the output stage to use the supply voltage or the regulated supply voltage to generate the output audio signal.

According to one embodiment of the present invention, an audio processing circuit comprising a digital signal processing circuit, a digital modulation circuit, an output stage, an ADC and a signal detection circuit is disclosed. The digital signal processing circuit is configured to process a digital audio signal to generate a processed signal. The digital modulation circuit is configured to generate a modulated signal according to the processed signal. The output stage is configured to generate an output audio signal according to the modulated signal. The ADC is configured to perform an analog-to-digital conversion operation on the output audio signal to generate a digital signal. The signal detection circuit is configured to detect a signal strength of the digital audio signal and/or the processed signal to generate a control signal to control whether the digital modulation circuit refers to a feedback signal to generate the modulated signal, wherein the feedback signal is generated according to the analog signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
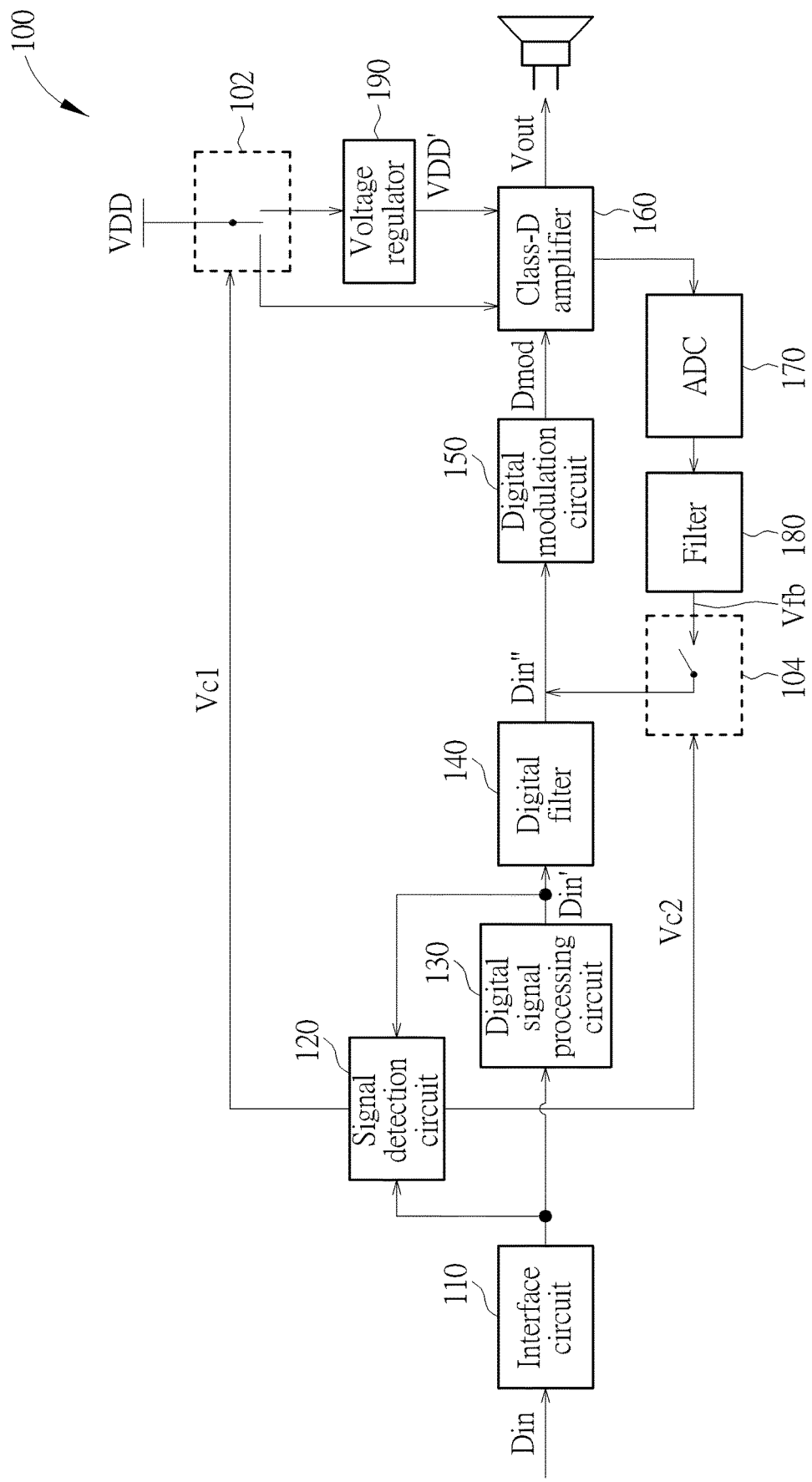
FIG. 1 is a diagram illustrating an audio processing circuit according to one embodiment of the present invention.

FIG. 1 is a diagram illustrating an audio processing circuit 100 according to one embodiment of the present invention. As shown in FIG. 1, the audio processing circuit 100 includes an input interface 110, a signal detection circuit 120, a digital signal processing circuit 130, a digital filter 140, a digital modulation circuit 150, a class-D amplifier 160 serving as an output stage, an ADC 170, a filter 180, a voltage regulator 190, and two switching circuits 102, 104. In this embodiment, the audio processing circuit 100 is used to receive a digital audio signal Din and then generate an output audio signal Vout to a speaker to control the speaker to play sound. The audio processing circuit 100 of this embodiment can be installed in any electronic device that needs to play sound.

In the operation of the audio processing circuit 100, first, the input interface 110 receives the digital audio signal Din, where the input interface 110 may be capable of receiving signals that comply with I2S specification, pulse density modulation (PDM), or any other digital audio signal type. Then, the digital signal processing circuit 130 can perform digital signal processing on the digital audio signal Din, such as volume adjustment, equalization, etc., to generate a processed signal Din', and the digital filter 140 filters the processed signal Din to generate a filtered signal Din". Then, the digital modulation circuit 150 modulates the filtered signal Din" to generate a modulated signal Dmod, that is, the digital modulation circuit 150 encodes the filtered signal Din" into a pulse-width modulation (PWM) or pulse-density modulation (PDM) signal to drive the class-D amplifier 160 to generate the output audio signal Vout.

The operations of the input interface 110, the digital signal processing circuit 130, the digital filter 140, the digital modulation circuit 150, and the class-D amplifier 160 described above are already well known to those with ordinary skill in the art, so the detailed operations are omitted here.

In the audio processing circuit 100 including the class D amplifier 160, the total harmonic distortion and noise (THD+N) is an important performance indicator. However, when the audio processing circuit 100 needs to generate a loud output audio signal Vout, the performance indicator (THD+N) is dominated by the total harmonic distortion, and the noise has a small effect on the performance indicator. On the other hand, when the audio processing circuit 100 needs to generate a low-volume output audio signal Vout, the performance indicator (THD+N) is dominated by the noise, and the total harmonic distortion has a small effect on the performance indicator. Therefore, the audio processing circuit 100 of this embodiment additionally designs the signal detection circuit 120, the ADC 170, the filter 180, the voltage regulator 190 and two switching circuits 102 and 104, so that the audio processing circuit 100 can adopt different operation modes according to the intensity/volume of the currently processed signal.

Specifically, the signal detection circuit 120 can detect the signal strength of the digital audio signal Din (for example, the volume level indicated by the digital audio signal) and/or the signal strength of the processed signal Din' to generate control signals Vc1 and Vc2. In one example, the signal detection circuit 120 may only detect the signal strength of the digital audio signal Din. In another example, the digital signal processing circuit 130 may adjust the volume of the digital audio signal Din therefore, the signal detection circuit 120 can only detect the signal strength of the processed signal Din', or combine the signal strengths of the digital audio signal Din and the processed signal Din' into overall consideration, to generate the control signal Vc1 and Vc2.

The control signal Vc1 is used to control the switching circuit 102 so that the class-D amplifier 160 can be directly powered by a supply voltage VDD or a regulated supply voltage VDD' provided by the voltage regulator 190. The control signal Vc2 is used to control the switching circuit 104 so that the class-D amplifier 160 has an open-loop structure or a closed-loop structure.

Figure 2:
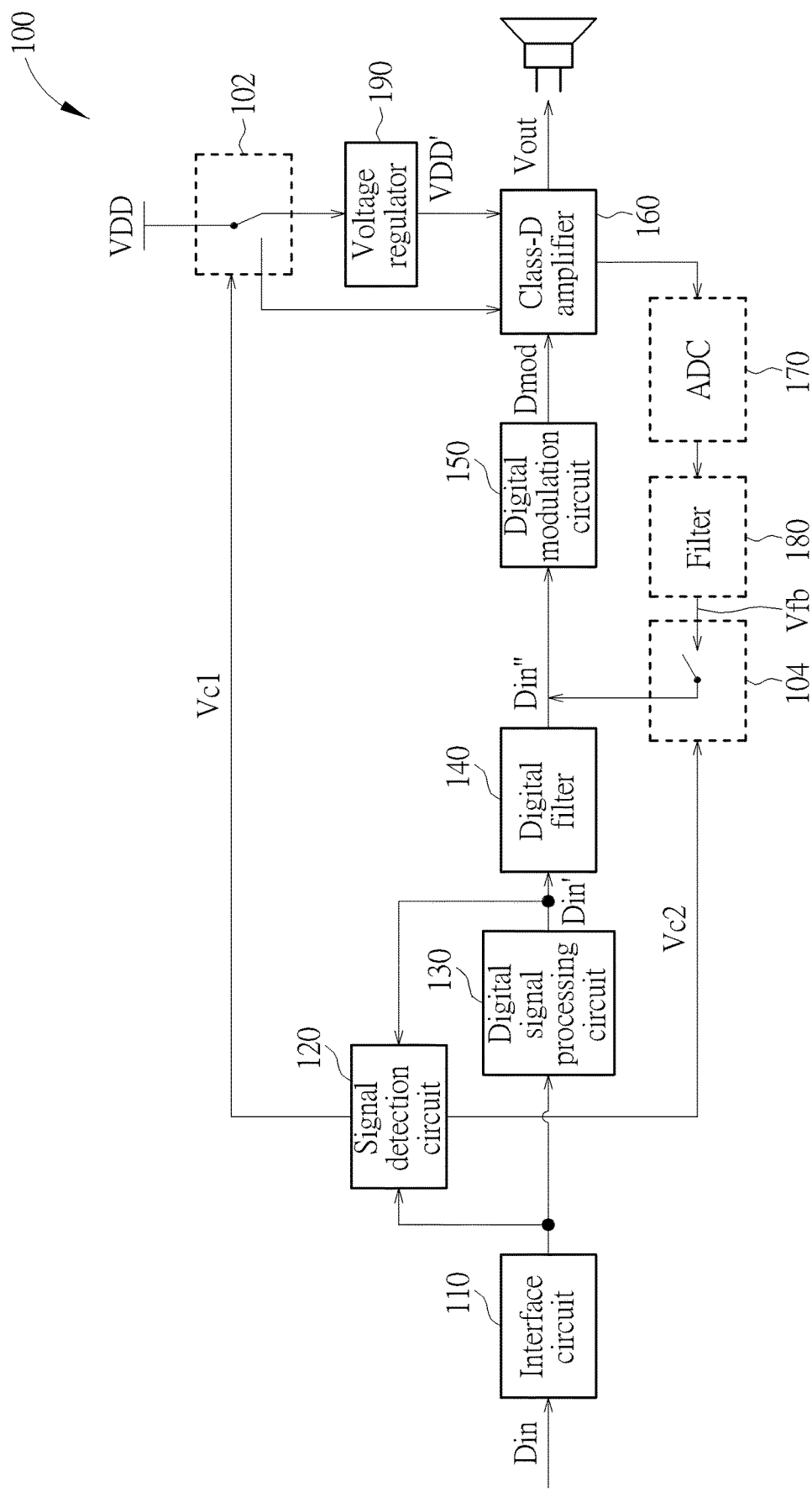
FIG. 2 is a diagram of the audio processing circuit operating in a small signal mode.

Specifically, referring to FIG. 2, when the signal detection circuit 120 determines that the current digital audio signal Din and/or the signal strength of the processed signal Din' is a small signal, for example, the power consumption corresponding to the class-D amplifier 160 is less than 100 milli-Watts (mW), the signal detection circuit 120 can generate the control signal Vc1 so that the switching circuit 102 connects the supply voltage VDD to the voltage regulator 190. The voltage regulator 190 can be implemented by using a low dropout regulator (LDO) to process the supply voltage VDD to generate a regulated supply voltage VDD', and the class-D amplifier 160 will only receive the regulated supply voltage VDD' from the voltage regulator 190, that is, the class-D amplifier 160 is not powered by the supply voltage VDD. Furthermore, the signal detection circuit 120 generates the control signal Vc2 to disconnect the path between the filter 180 and the digital modulation circuit 150, that is, the class-D amplifier 160 has the open-loop structure, and at this time, the ADC 170 and the filter 180 will not generate a feedback signal to the digital modulation circuit 150 for adjusting the filtered signal Din''.

In the audio processing circuit 100 operating in the small signal mode shown in FIG. 2, since the voltage regulator 190 suppresses and attenuates the power noise in the supply voltage VDD, the class-D amplifier 160 powered by the regulated supply voltage VDD'' will have better performance due to less power supply noise. In addition, since the class D amplifier 160 has the open-loop structure, the noise of the ADC 170 will not affect the output audio signal Vout, so the performance of the class-D amplifier 160 can be maintained. As mentioned above, the audio processing circuit 100 can have a low noise level in the case of a small signal (low volume), so as to improve the performance indicator (THD+N or SNR).

Figure 3:
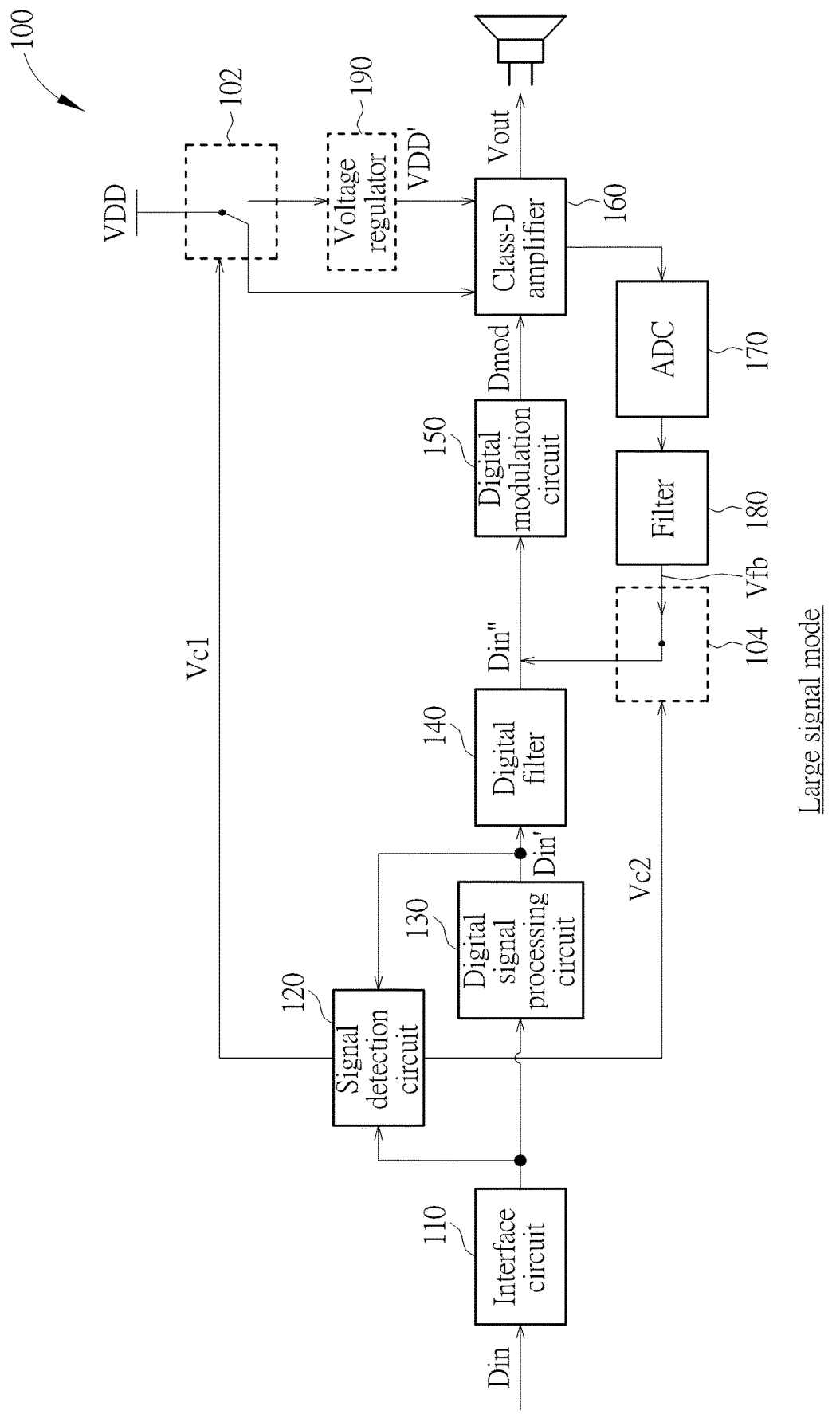
FIG. 3 is a diagram of the audio processing circuit operating in a large signal mode.

On the other hand, referring to FIG. 3, when the signal detection circuit 120 determines that the signal strength of the current digital audio signal Din and/or the processed signal Din' is a large signal, for example, the power consumption corresponding to the class-D amplifier 160 is greater than 100 mW, the signal detection circuit 120 can generate the control signal Vc1 so that the switching circuit 102 directly connects the supply voltage VDD to the class D amplifier 160, and the voltage regulator 190 can be disabled at this time. In addition, the signal detection circuit 120 generates the control signal Vc2 to connect the path between the filter 180 and the digital modulation circuit 150, that is, the class-D amplifier 160 has the closed-loop structure, and the ADC 170 will perform an analog-to-digital conversion operation on the output audio signal Vout to generate a digital signal, and the digital signal is processed by the filter 180 to generate a feedback signal Vfb, which is used to adjust the filtered signal Din''.

In the audio processing circuit 100 operating in the large signal mode shown in FIG. 3, since the class-D amplifier 160 has the closed-loop structure, it can eliminate its own nonlinear phenomenon and noise caused by the supply voltage VDD. In addition, because in the case of a large signal (large volume), the performance indicator of the class-D amplifier 160 is dominated by the total harmonic distortion, therefore, the noise generated by the ADC 170 has little effect on the performance indicator.

Referring to the operation of the audio processing circuit 100 above, since the ADC 170 only needs to be operated in the large signal mode, and the performance indicator of the class-D amplifier 160 in the large signal mode is dominated by the total harmonic distortion, therefore, the ADC 170 can be designed with a smaller chip area without too much consideration of the noise generated by itself. In addition, since the class-D amplifier 160 is directly powered by the supply voltage VDD in the large signal mode, and the voltage regulator 190 is only used in the small signal mode, the voltage regulator 190 can also be designed with a smaller chip area, without the need to design a circuit structure that supports a larger current. In addition, the signal detection circuit 120 is implemented using a digital circuit, so it also has a small chip area. In summary, the audio processing circuit 100 of this embodiment can maintain a good performance indicator while having a small chip area.

It is noted that, in order to prevent the audio processing circuit 100 from repeatedly switching between the large signal mode and the small signal mode, causing some inconsistencies in the output audio signal Vout, the signal detection circuit 120 may have a de-bounce mechanism. For example, the signal detection circuit 120 can detect the digital audio signal Din and/or an average signal intensity of the processed signal Din' over a period of time, so as to determine whether it should be a small signal mode or a large signal model. In another example, the signal detection circuit 120 can switch from the small signal mode to the large signal mode only when the signal strength of the digital audio signal Din and/or the processed signal Din' is higher than a first threshold value, and switch from the large signal mode to the small signal mode only when the signal strength of the digital audio signal Din and/or the processed signal Din' is lower than a first threshold value, wherein the first threshold value is higher than the second threshold value. It should be noted that the above-mentioned switching mechanism between the small signal mode and the large signal mode is only an example for illustration, not a limitation of the present invention.

Briefly summarized, in the audio processing circuit of the present invention, when the audio processing circuit determines that the processed signal is a small signal, the output stage uses the regulated supply voltage provided by the voltage regulator for power supply, and the output stage uses an open-loop structure to reduce the noise of the output audio signal. When the audio processing circuit determines that the processed signal is a large signal, the output stage directly uses the supply voltage, and the output stage uses a closed-loop structure to reduce the total harmonic distortion of the output audio signal. By using the audio processing circuit of the present invention the audio processing circuit can have a good performance indicator with a small chip area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An audio processing circuit, comprising:
a digital signal processing circuit, configured to process a digital audio signal to generate a processed signal;
a digital modulation circuit, configured to generate a modulated signal according to the processed signal;
an output stage, configured to generate an output audio signal according to the modulated signal;
a voltage regulator, configured to receive a supply voltage and suppress and attenuate power noise in the supply voltage to generate a regulated supply voltage; and
a signal detection circuit, configured to detect a signal strength of the digital audio signal and/or the processed signal to generate a first control signal to control the output stage to use the supply voltage or the regulated supply voltage to generate the output audio signal;
wherein when the signal detection circuit detects the signal strength of the digital audio signal and/or the processed signal, and the signal detection circuit determines that the digital audio signal and/or the processed signal is a small signal, the signal detection circuit generates the first control signal to control the output stage to use the regulated supply voltage, without using the supply voltage; and when the signal detection circuit determines that the digital audio signal and/or the processed signal is a large signal, the signal detection circuit generates the first control signal to control the output stage to use the supply voltage, without using the regulated supply voltage.

2. The audio processing circuit of claim 1, further comprising:
a switching circuit, configured to selectively connect the supply voltage to the output stage or the voltage regulator;
wherein when the signal detection circuit determines that the digital audio signal and/or the processed signal is the small signal, the signal detection circuit generates the first control signal to control the switching circuit to connect the supply voltage to the voltage regulator, and the output stage does not receive the supply voltage; and when the signal detection circuit determines that the digital audio signal and/or the processed signal is the large signal, the signal detection circuit generates the first control signal to control switching circuit to connect the supply voltage to the output stage, and the voltage regulator does not generate the regulated supply voltage to the output stage.

3. The audio processing circuit of claim 1, further comprising:
an analog-to-digital converter (ADC), configured to perform an analog-to-digital conversion operation on the output audio signal to generate a digital signal; and
a filter, configured to filter the digital signal to generate a feedback signal;
wherein the signal detection circuit detects the signal strength of the digital audio signal and/or the processed signal to generate a second control signal to control whether the digital modulation circuit refers to the feedback signal to generate the modulated signal.

4. The audio processing circuit of claim 3, wherein when the signal detection circuit detects the signal strength of the digital audio signal and/or the processed signal, and the signal detection circuit determines that the digital audio signal and/or the processed signal is the small signal, the signal detection circuit generates the second control signal to control the digital modulation circuit to not refer to the feedback signal to generate the modulated signal; and when the signal detection circuit determines that the digital audio signal and/or the processed signal is the large signal, the signal detection circuit generates the second control signal to control the digital modulation circuit to refer to the feedback signal to generate the modulated signal.

5. The audio processing circuit of claim 4, further comprising:
a switching circuit, configured to selectively connect the filter to the digital modulation circuit;
wherein when the signal detection circuit determines that the digital audio signal and/or the processed signal is the small signal, the signal detection circuit generates the second control signal to disconnect the path between the filter and the digital modulation circuit; and when the signal detection circuit determines that the digital audio signal and/or the processed signal is the large signal, the signal detection circuit generates the second control signal to control the switching circuit to connect the filter to the digital modulation circuit.

6. The audio processing circuit of claim 1, wherein the output stage is a class-D amplifier.

* * * * *